US007353476B2

(12) United States Patent
Imada et al.

(10) Patent No.: US 7,353,476 B2
(45) Date of Patent: Apr. 1, 2008

(54) SYSTEM, METHOD AND COMPUTER PROGRAM PRODUCT FOR DESIGNING CONNECTING TERMINALS OF SEMICONDUCTOR DEVICE (75) Inventors: Tomohiko Imada, Ebina (JP); Seiji Watanabe, Funabashi (JP); Toyokazu Shibata, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 1164 days.

(21) Appl. No.: 10/617,931

(22) Filed: Jul. 11, 2003

(65) Prior Publication Data
US 2007/0245276 A1 Oct. 18, 2007

(30) Foreign Application Priority Data
Jul. 12, 2002 (JP) ............................ P2002-204776

(51) Int. Cl.
*G06F 17/50* (2006.01)
(52) U.S. Cl. ..................... 716/5; 716/1; 716/12; 716/19
(58) Field of Classification Search .................... 716/1, 716/2, 4, 5, 12, 19
See application file for complete search history.

(56) References Cited
U.S. PATENT DOCUMENTS
5,885,855 A * 3/1999 Liang .......................... 438/128

FOREIGN PATENT DOCUMENTS
| JP | 08-110918 | 4/1996 |
| JP | 09-325979 | 12/1997 |
| JP | 2001-060625 | 3/2001 |

* cited by examiner

Primary Examiner—Thuan Do
(74) Attorney, Agent, or Firm—Kilpatrick Stockton LLP (57) ABSTRACT A system for designing connecting terminals of a semiconductor device, having a power supply cell arranging unit configured to arrange power supply cells at some of I/O slots formed in a semiconductor chip, an I/O signal cell arranging unit configured to arrange I/O signal cells at some of the I/O slots where the power supply cells are not arranged, a first connecting net generator configured to generate a first connecting net connecting the I/O slots to bumps formed on the semiconductor chip, a second connecting net generator configured to generate a second connecting net connecting the bumps to external electrodes formed on a package base, and a verifier configured to verify whether the power supply cells, I/O signal cells, and first and second connecting nets violate predetermined design rules.

13 Claims, 10 Drawing Sheets

SYSTEM, METHOD AND COMPUTER PROGRAM PRODUCT FOR DESIGNING CONNECTING TERMINALS OF SEMICONDUCTOR DEVICE

CROSS REFERENCE TO RELATED APPLICATIONS

This application is based upon and claims the benefit of priority from the prior Japanese Patent Application No. P2002-204776 filed on Jul. 12, 2002; the entire contents of which are incorporated herein by reference.

BACKGROUND OF THE INVENTION

1. Field of the Invention

The present invention relates to a system, method, and computer program product for designing connecting terminals of a semiconductor device, and particularly, to a pin assign process carried out before an automatic chip arranging/wiring process and a detailed package designing process in a semiconductor design flow.

2. Description of Related Art

Figure 1:
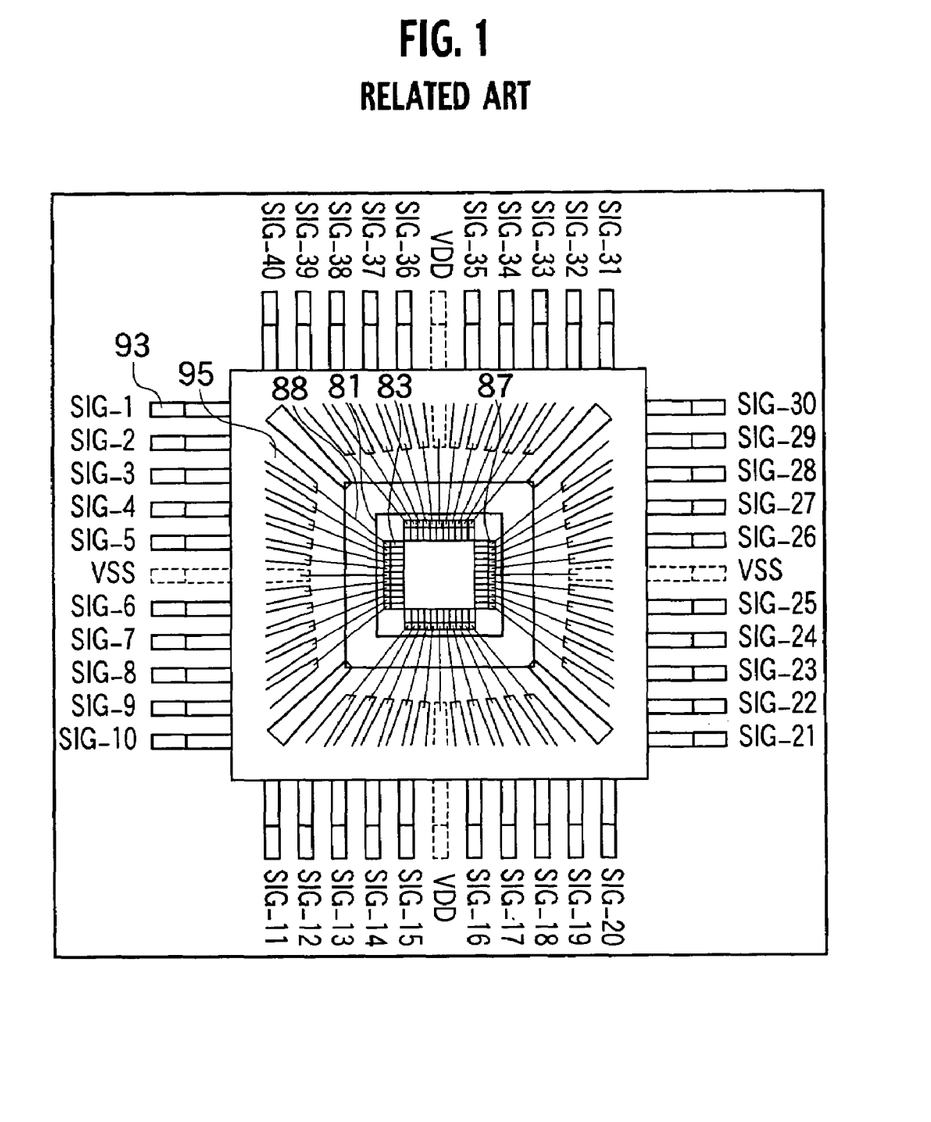
FIG. 1 is a plan view showing a QFP according to a related art.

FIG. 1 shows a quad flat package (QFP) according to a related art. The package includes package pins 93 arranged along the periphery of the package and inner lead pins 95 arranged inside the package and connected to a semiconductor chip 81. The pins 93 and 95 linearly run on the periphery of the package, and therefore, correspondences between the pins 93 and 95 are clear. The semiconductor chip 81 has bonding pads 87 that are linearly arranged on the periphery of the chip 81, and therefore, correspondences between the bonding pads 87 and the inner lead pins 95 of the package are clear. Namely, the positions of the bonding pads 87 relative to those of the inner lead pins 95 are sequential. Also, correspondences between the bonding pads 87 and I/O slots 83 formed in the semiconductor chip 81 are clear, and the positions of the bonding pads 87 relative to those of the I/O slots 83 are sequential.

When signals such as SIG1 to SIG40, VDD, and VSS are assigned to the package pins 93, assignment of these signals to the inner lead pins 95 and bonding pads 87 is automatically determined. Namely, a connecting net from the package pins 93 to the bonding pads 87 is determined automatically. In addition, specific I/O slots 83 for which I/O buffers are provided and a connecting net between the bonding pads 87 and the I/O slots 83 are also determined automatically. Special cells such as differential buffer cells that must be assigned to adjacent I/O slots 83 may be assigned to adjacent package pins 93 during a package pin arranging stage, and then, the differential buffer cells are automatically arranged at adjacent I/O slots 83. The pin assignment or the assignment of connecting terminals mentioned above for the QFP is also applicable to, for example, a ball grid array (BGA) involving single-layer pin connections.

There are BGAs involving multilayer pin connections. Packages such as the multilayer-pin-connection BGAs (hereinafter referred to simply as the BGAs) and flip-chip packages are capable of coping with recent high-density, multiple-pin semiconductor devices. When designing connecting terminals, however, these packages have some technical problems due to the structures thereof being different from those of the QFPs.

The BGA has external electrodes (ball electrodes) formed in a grid on a principal surface of a package base. The external electrodes of the BGA correspond to the package pins 93 of the QFP. The flip-chip package has bumps (protruding electrodes) formed in a grid on a principal surface of a semiconductor chip, so that the chip may be packaged on a package base through the bumps. In the BGA or the flip-chip package, correspondences between the external electrodes on the package base and the bumps on the chip and correspondences between the bumps on the chip and I/O slots in the chip are not clear. In addition, the positions of the bumps relative to those of the external electrodes and the positions of the I/O slots relative to those of the bumps are not sequential.

Accordingly, assigning signals to the external electrodes does not automatically determine assignment of these signals to the bumps and I/O slots. As a result, the assignment of signals to the external electrodes, and pin assignment of the bumps and I/O slots must be manually carried out.

Generally, a connecting net from bumps on a semiconductor chip to external terminals of a package base is radially made in an initial design stage. When signals for differential buffers are assigned to adjacent external electrodes of the radial connecting net in the BGA, it is not always the case that these signals are assigned to adjacent bumps. Further, there is a high probability of differential buffer cells not being arranged at adjacent I/O slots. Design requirements concerning, for example, equal-length wires and pair wires needed by cell specifications are insufficiently satisfied in the BGA. To solve these problems, one may change the assignment of signals to the external terminals, bumps, and I/O slots. This, however, results in increasing the number of wiring intersections in each connecting net, thus making detailed wiring designing difficult.

SUMMARY OF THE INVENTION

A first aspect of the present invention provides a system for designing connecting terminals of a semiconductor device, having a power supply cell arranging unit configured to arrange power supply cells at some of I/O slots formed in a semiconductor chip, an I/O signal cell arranging unit configured to arrange I/O signal cells at some of the I/O slots where the power supply cells are not arranged, a first connecting net generator configured to generate a first connecting net connecting the I/O slots to bumps formed on the semiconductor chip, a second connecting net generator configured to generate a second connecting net connecting the bumps to external electrodes formed on a package base, and a verifier configured to verify whether the power supply cells, I/O signal cells, and first and second connecting nets violate predetermined design rules.

A second aspect of the present invention provides a method of designing connecting terminals of a semiconductor device, having arranging power supply cells at some of I/O slots formed in a semiconductor chip, arranging I/O signal cells at some of the I/O slots where the power supply cells are not arranged, generating a first connecting net connecting the I/O slots to bumps formed on the semiconductor chip, generating a second connecting net connecting the bumps to external electrodes formed on a package base, and verifying whether the power supply cells, I/O signal cells, and first and second connecting nets violate predetermined design rules.

A third aspect of the present invention provides a computer program product for designing connecting terminals of a semiconductor device, having instructions configured to arrange power supply cells at some of I/O slots formed in a semiconductor chip, instructions configured to arrange I/O signal cells at some of the I/O slots where the power supply cells are not arranged, instructions configured to generate a first connecting net connecting the I/O slots to bumps formed on the semiconductor chip, instructions configured to generate a second connecting net connecting the bumps to external electrodes formed on a package base, and instructions configured to verify whether the power supply cells, I/O signal cells, and first and second connecting nets violate predetermined design rules.

DETAILED DESCRIPTION OF EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

<Semiconductor Device>

Before explaining the designing of connecting terminals of a semiconductor device according to embodiments of the present invention, a semiconductor device packaged in a flip-chip BGA for which connecting terminals are designed according to the embodiments will be explained.

Figure 2:
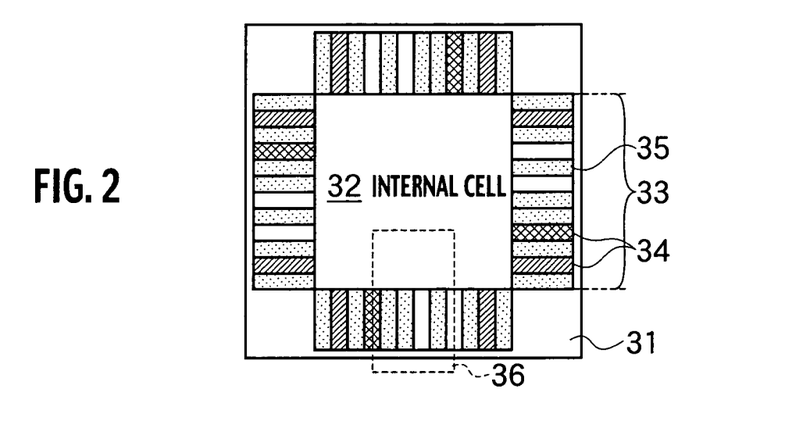
FIG. 2 is a plan view generally showing a semiconductor chip to be packaged in a flip-chip BGA.

FIG. 2 is a plan view generally showing a semiconductor chip to be packaged in a flip-chip BGA. The semiconductor chip 31 has I/O slots 33 linearly arranged on a quadrate periphery of the chip 31 and an internal cell 32 arranged inside the I/O slots 33. At the I/O slots 33, power supply cells 34 and I/O signal cells 35 are arranged. The internal cell 32 is configured to provide specific functions such as operational functions and storage functions. The power supply cells 34 mainly provide the I/O signal cells 35 with an operation voltage and usually include power output cells, power input cells, and power input/output cells. Bumps formed on a principle surface of the semiconductor chip 31 are not shown in FIG. 2. A relationship between the bumps and the I/O slots 33 will be explained later in connection with FIGS. 3A and 3B.

Figure 3A:
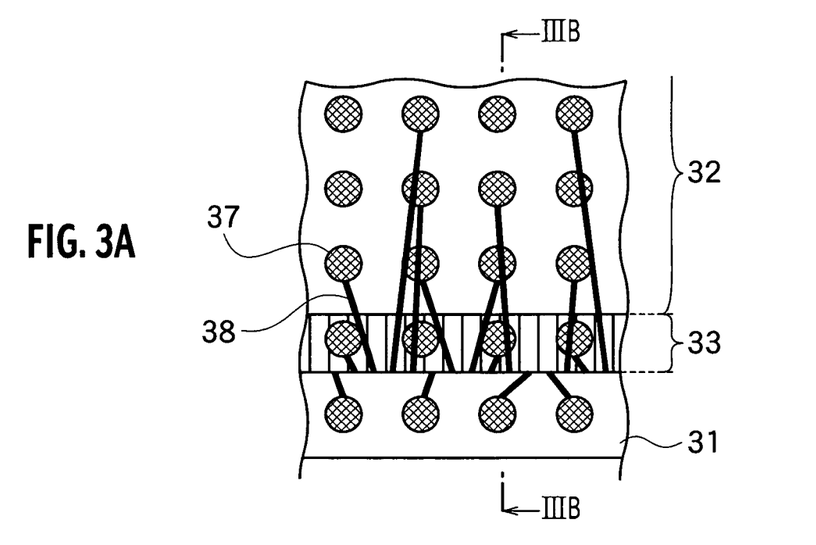
FIG. 3A is an enlarged view showing an area encircled with a dotted line in FIG. 2.

FIG. 3A is an enlarged view showing an area encircled with a dotted line in FIG. 2. In FIG. 3A, the bumps 37 are arranged in a grid on the semiconductor chip 31. The bumps 37 are arranged on an area where the internal cell is formed, on an area where the I/O slots 33 are formed, and on an area extending from the I/O slots 33 to the peripheral edge of the chip 31. In this way, the bumps 37 are arranged all over the principle surface of the semiconductor chip 31. The I/O slots 33 are connected to the bumps 37 in a one-to-one relationship through a first connecting net 38. The first connecting net 38 has lines that substantially linearly connect the I/O slots 33 and bumps 37 to each other. It must be noted that these lines forming the first connecting net 38 are not identical with wires that actually connect the I/O slots 33 and bumps 37 to each other in a real semiconductor device. The wires that actually connect the I/O slots 33 and bumps 37 to each other are designed based on the first connecting net 38 in a chip arranging/wiring process to be explained later.

Figure 3B:
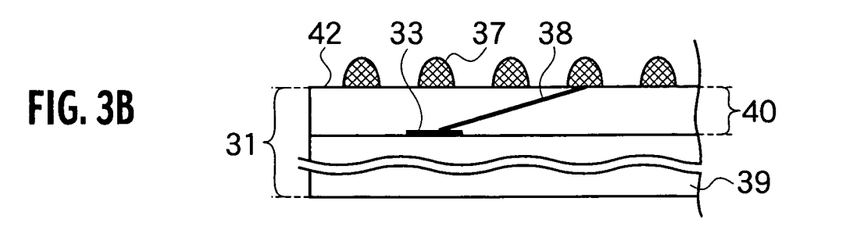
FIG. 3B is a sectional view taken along a line IIIB-IIIB of FIG. 3A.

FIG. 3B is a sectional view taken along a line IIIB-IIIB of FIG. 3A and showing the I/O slots 33, bumps 37, and first connecting net 38 in a chip thickness direction. The I/O slots 33 are formed on a semiconductor substrate 39 of the semiconductor chip 31. On the I/O slots 33, a first connecting net region 40 is formed, and on the region 40, the bumps 37 are formed. The bumps 37 are arranged on the principle surface 42 of the chip 31. The first connecting net 38 or actual wires are formed in the first connecting net region 40.

Figure 4A:
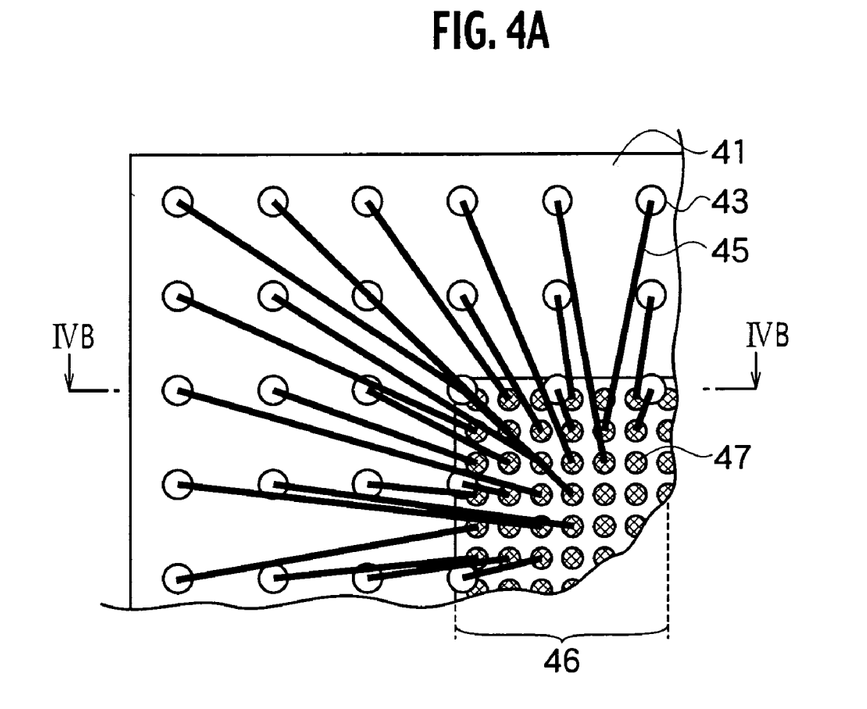
FIG. 4A is a plan view partly showing a package base of a flip-chip BGA on which the semiconductor chip of FIG. 2 is packaged.

FIG. 4A is a plan view partly showing a package base 41 of the flip-chip BGA on which the semiconductor chip 31 is packaged. The package base 41 has external electrodes 43 arranged in a grid and a chip area 46 at the center of the package base 41 to receive the chip 31. The chip area 46 has bump contacts 47 at locations corresponding to the bumps 37 of FIG. 3A. The bump contacts 47 are connected to the external electrodes 43 through a second connecting net 45. The second connecting net 45 has lines that substantially linearly connect the bump contacts 47 and external electrodes 43 to each other. It must be noted that these lines forming the second connecting net 45 are not identical with wires that actually connect the bump contacts 47 and external electrodes 43 to each other in a real semiconductor device. The wires that actually connect the bump contacts 47 and external electrodes 43 to each other are designed based on the second connecting net 45 in a detailed package designing process to be explained later. To clearly show the second connecting net 45 between the bump contacts 47 and the external electrodes 43, FIG. 4A omits the external electrodes 43 formed on the chip area 46.

Figure 4B:
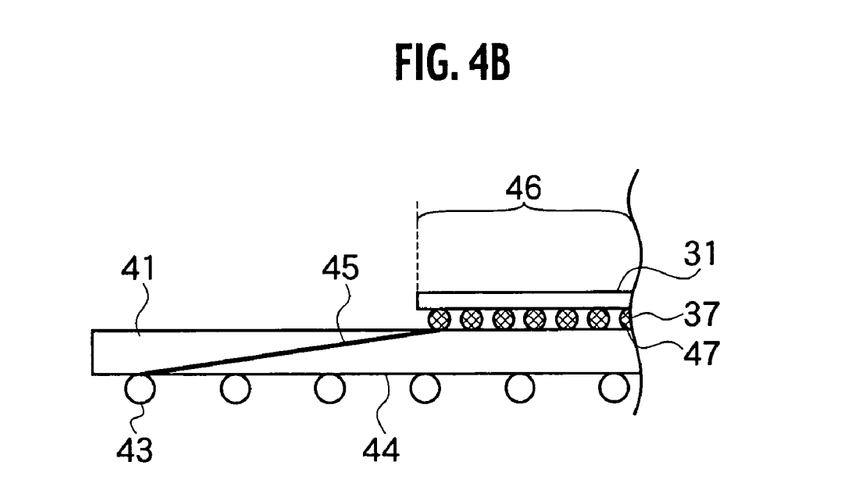
FIG. 4B is a sectional view taken along a line IVB-IVB of FIG. 4A.

FIG. 4B is a sectional view taken along a line IVB-IVB of FIG. 4A and showing the bump contacts 47, external electrodes 43, and second connecting net 45 in a package thickness direction. On the principle surface 44 of the package base 41, the external electrodes 43 are formed, and on a surface opposite to the principle surface 44 of the package base 41, the bump contacts 47 are formed. The semiconductor chip 31 is connected through the bumps 37 to the package base 41 in the chip area 46 on the surface opposite to the principle surface 44 of the package base 41. The bumps 37 are connected to the bump contacts 47 of the package base 41. The second connecting net 41 or actual wires are formed in the package base 41, to connect the bumps 37 and external electrodes 43 to each other.

Figure 5:
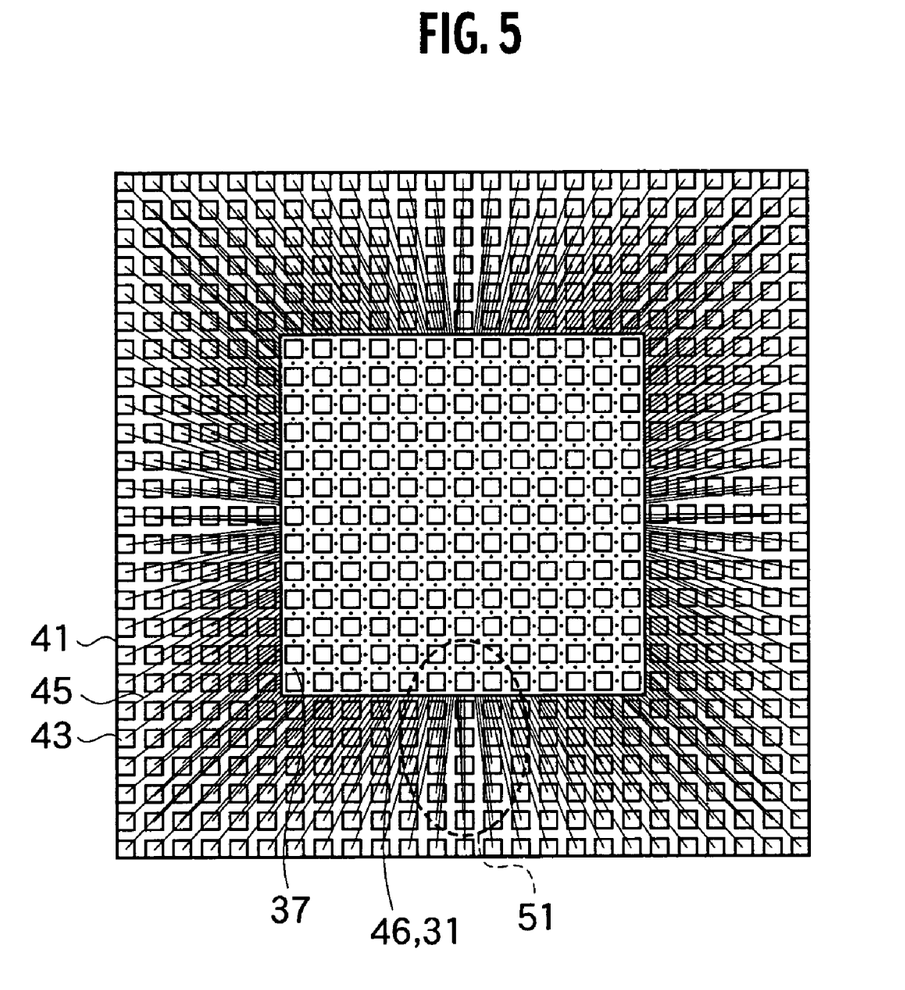
FIG. 5 is a plan view generally showing an example of a flip-chip BGA.

FIG. 5 is a plan view generally showing an example of the flip-chip BGA. External electrodes 43 are formed in a grid all over a principle surface of a quadrate package base 41. At the center of the package base 41, a quadrate chip area 46 is formed. A semiconductor chip 31 is connected to the chip area 46 through bumps 37. The bumps 37 are formed in a grid all over the principle surface of the chip 31. The bumps 37 and external electrodes 43 are connected to each other through a second connecting net 45.

Figure 6:
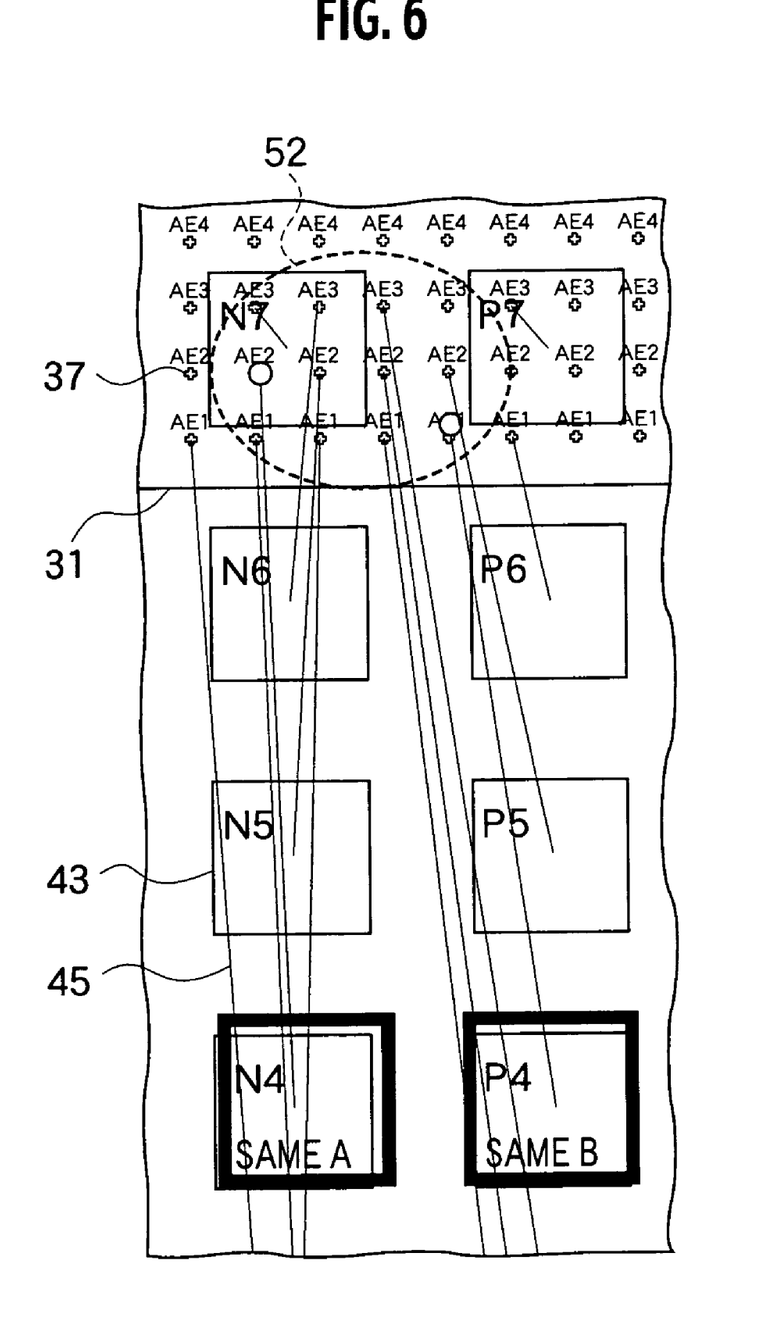
FIG. 6 is an enlarged plan view partly showing an elliptic area encircled with a dotted line in FIG. 5.

FIG. 6 is an enlarged plan view partly showing an elliptic area 51 encircled with a dotted line in FIG. 5. The bumps 37 on the semiconductor chip 31 are connected to the external electrodes 43 through the second connecting net 45.

Figure 7:
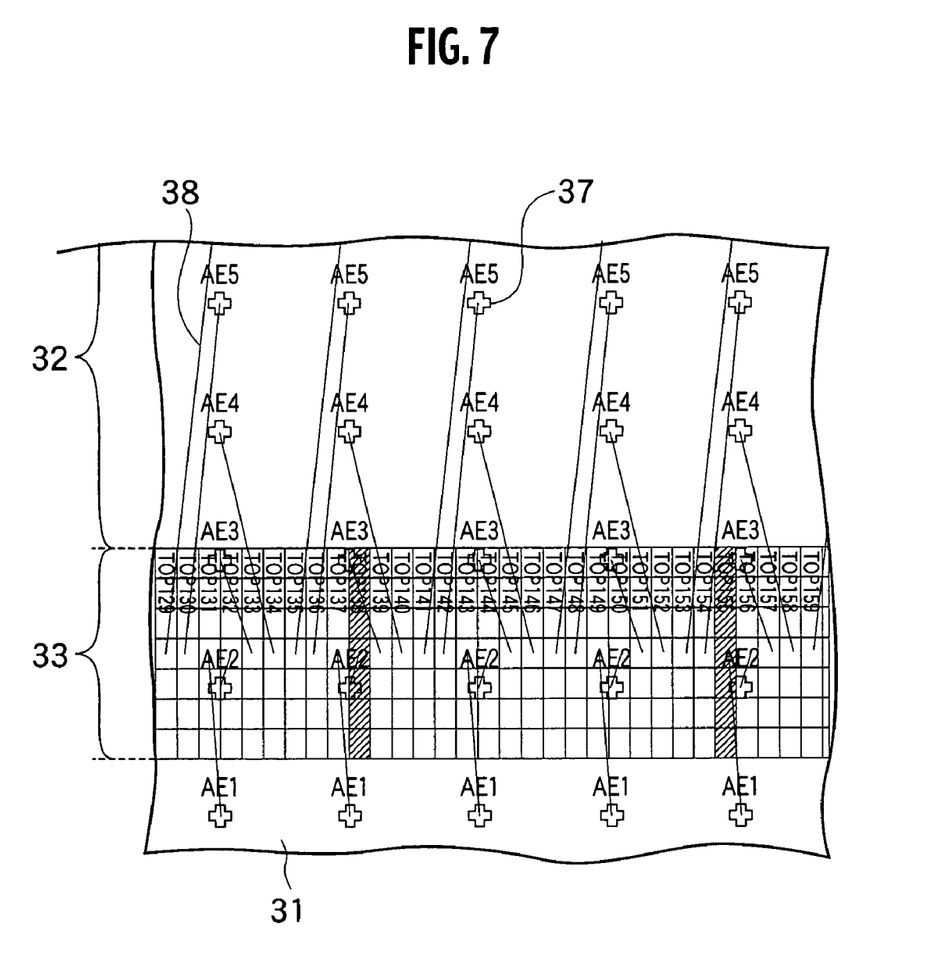
FIG. 7 is an enlarged plan view partly showing an elliptic area encircled with a dotted line in FIG. 6.

FIG. 7 is an enlarged plan view partly showing an elliptic area 52 encircled with a dotted line in FIG. 6. I/O slots 33 are linearly arranged on the periphery of the semiconductor chip 31, and an internal cell 32 is formed inside the I/O slots 33. The bumps 37 are arranged in a grid all over the principle surface of the chip 31. The I/O slots 33 in the chip 31 are connected to the bumps 37 on the chip 31 in a one-to-one relationship through a first connecting net 38.

The "I/O slot" is a subordinate term contained in the superordinate term "connecting terminal." Properly assigning the power supply cells 34 and I/O signal cells 35 to the I/O slots 33 is a task conducted by the designing of connecting terminals of a semiconductor device. The "bump" and "external electrode" are also subordinate terms contained in the superordinate term "connecting terminal." Properly assigning power supply signals and I/O signals to the bumps 37 and external electrodes 43 is also a task conducted by the designing of connecting terminals of a semiconductor device.

<System for Designing Connecting Terminals>

Figure 8:
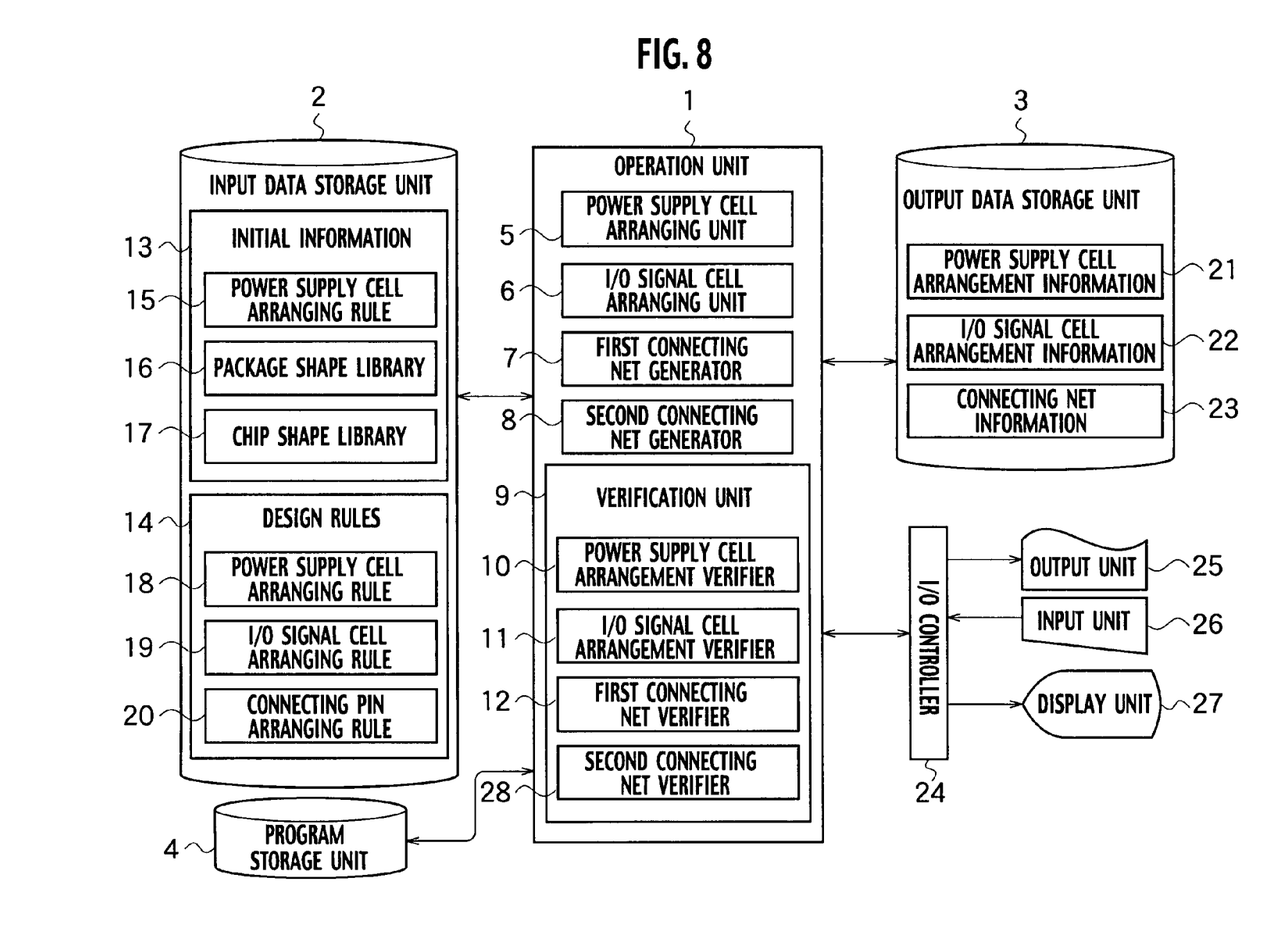
FIG. 8 is a block diagram showing a system for designing connecting terminals of a semiconductor device according to an embodiment of the present invention.

FIG. 8 is a block diagram showing a system for designing connecting terminals of a semiconductor device according to an embodiment of the present invention. The system includes an operation unit 1 having a function of designing connecting terminals, an input data storage unit 2 connected to the operation unit 1, an output data storage unit 3 connected to the operation unit 1, and a program storage unit 4 connected to the operation unit 1.

The operation unit 1 has a power supply cell arranging unit 5, an I/O signal cell arranging unit 6, a first connecting net generator 7, a second connecting net generator 8, and a verification unit 9. The verification unit 9 has a power supply cell arrangement verifier 10, an I/O signal cell arrangement verifier 11, a first connecting net verifier 12, and a second connecting net verifier 28. The input data storage unit 2 stores initial information 13 and design rules 14. The output data storage unit 3 stores power supply cell arrangement information 21, I/O signal cell arrangement information 22, and connecting net information 23. The initial information 13 in the input data storage unit 2 includes signal pin information 15, a package shape library 16, and a chip shape library 17. The design rules 14 in the input data storage unit 2 include a power supply cell arranging rule 18, an I/O signal cell arranging rule 19, and a connecting pin arranging rule 20.

The operation unit 1 may be a part of a central processing unit (CPU) of a standard computer system. The power supply cell arranging unit 5, I/O signal cell arranging unit 6, first connecting net generator 7, second connecting net generator 8, and verification unit 9 may each be made of dedicated hardware, or they may be provided as equivalent functions by software executed by the CPU.

The input data storage unit 2, output data storage unit 3, and program storage unit 4 may be semiconductor memories such as semiconductor ROMs and semiconductor RAMs, or external storage devices such as magnetic disk drives, magnetic drum devices, and magnetic tape devices, or may be secured in a main memory of the CPU.

The operation unit 1 is connected to an I/O controller 24, which is connected to an input unit 26 to receive data and instructions from an operator, an output unit 25 to output designed connecting terminals, and a display unit 27. The input unit 26 may include a keyboard, mouse, light pen, and flexible disk unit. The output unit 25 may include a printer. The display unit 27 may include a CRT or an LCD.

The input data storage unit 2 stores input data used by the operation unit 1 for various operations. The program storage unit 4 stores program instructions executed by the operation unit 1. The input data and program instructions are read into the CPU as and when needed, and the operation unit 1 in the CPU carries out operations according to the input data and program instructions. Data including numerical data generated by the operation unit 1 is stored in the output data storage unit 3, which may involve RAMs and magnetic disks.

The power supply cell arranging unit 5 arranges power supply cells at the proper I/O slots formed in a semiconductor chip according to the power supply cell arranging rule 18. The power supply cell arranging unit 5 computes the number of required power supply cells according to the signal pin information 15 and chip shape library 17 loaded to the CPU, and based on a result of the computation, arranges the required power supply cells at the proper positions. The number of the required power supply cells is computed in consideration of the simultaneous switching noise caused by output signal cells, and the current consumption and conditions of use of I/O signal cells and internal cells. The power supply cells must be arranged at optimum positions in the semiconductor chip. For example, power output cells must be arranged in the vicinities of output buffer cells, power input cells must be arranged in the vicinities of input buffer cells, and the appropriate number of power supply cells must be arranged for a group of simultaneous switching cells.

The I/O signal cell arranging unit 6 arranges I/O signal cells at the remaining I/O slots where no power supply cells are arranged, according to the I/O signal cell arranging rule 19. The I/O signal cells must be arranged in conformity with the power supply cells arranged by the power supply cell arranging unit 5.

The first connecting net generator 7 generates a first connecting net that connects the I/O slots to bumps formed on the semiconductor chip, according to the connecting pin arranging rule 20.

The second connecting net generator 8 generates a second connecting net that connects the bumps to external electrodes formed on a package base, according to the connecting pin arranging rule 20.

The verification unit 9 verifies whether the power supply cells, I/O signal cells, and first and second connecting nets violate predetermined design rules. According to the embodiment, the predetermined design rules are the design rules 14. More precisely, the power supply cell arrangement verifier 10 verifies whether the number and locations of the power supply cells violate the power supply cell arranging rule 18. The I/O signal cell arrangement verifier 11 verifies whether the locations of the I/O signal cells violate the I/O signal cell arranging rule 19. The first connecting net verifier 12 verifies whether the first connecting net violates the connecting pin arranging rule 20. The second connecting net verifier 28 verifies whether the second connecting net violates the connecting pin arranging rule 20.

When the verification unit 9 verifies that there is no violation of the design rules 14, the power supply cells, I/O signal cells, and first and second connecting nets are stored as the power supply cell arrangement information 21, I/O signal cell arrangement information 22, and connecting net information 23 in the output data storage unit 3. When violation of the design rules 14 are found, the verification unit 9 displays on the display unit 27 the violating items, violating locations, the details of the violation, and the like, to prompt an operator to change the design. The operator manually changes the locations of the power supply cells and I/O signal cells and corrects the first and second connecting nets on the display unit 27. The verification unit 9 again verifies whether the changed and corrected power supply cells, I/O signal cells, and first and second connecting nets violate the design rules 14.

The power supply cell arranging rule 18 stipulates the number and locations of power supply cells. The I/O signal cell arranging rule 19 stipulates the sizes and prohibited areas of I/O signal cells. The connecting pin arranging rule 20 stipulates requirements for equal-length wires and pair wires, the number of intersections in each connecting net, a maximum wiring length, and the number of rows of bumps allowed for making leads.

The "connecting pin" is a subordinate term contained in the superordinate term "connecting terminal" and is a superordinate term containing the terms "bump" and "external electrode."

The signal pin information 15 includes signal names, I/O buffer names, requirements for equal-length wires and pair wires in package wiring, and the like. The package shape library 16 includes information about the positional coordinates of the external electrodes. The chip shape library 17 includes information about the positional coordinates of the I/O slots and bumps.

As mentioned above, the units 5 to 8 in the operation unit 1 of FIG. 8 assign power supply signals and I/O signals to connecting terminals including the I/O slots, bumps, and external electrodes. Then, the verification unit 9 in the operation unit 1 verifies whether the connecting terminals violate the design rules 14. Even if correspondences between the external electrodes and the bumps and those between the bumps and the I/O slots are not clear or not sequential, the embodiment of the present invention can efficiently assign signals to the connecting terminals without violating the design rules 14.

Based on the design rules 14, the verification unit 9 can more accurately achieve verification than manual verification by designers and can determine manufacturability before the automatic chip arranging/wiring process and detailed package designing process. As a result, even if a pin assign error is found after the pin assigning process, there is no need of repeating the automatic chip arranging/wiring process or the detailed package designing process.

Recent semiconductor devices involve increased numbers of pins and complicated design specifications. For such semiconductor devices, the system for designing connecting pins according to the embodiment provides many benefits such as shortening the design period.

<Method of Designing Connecting Terminals>

Figure 9:
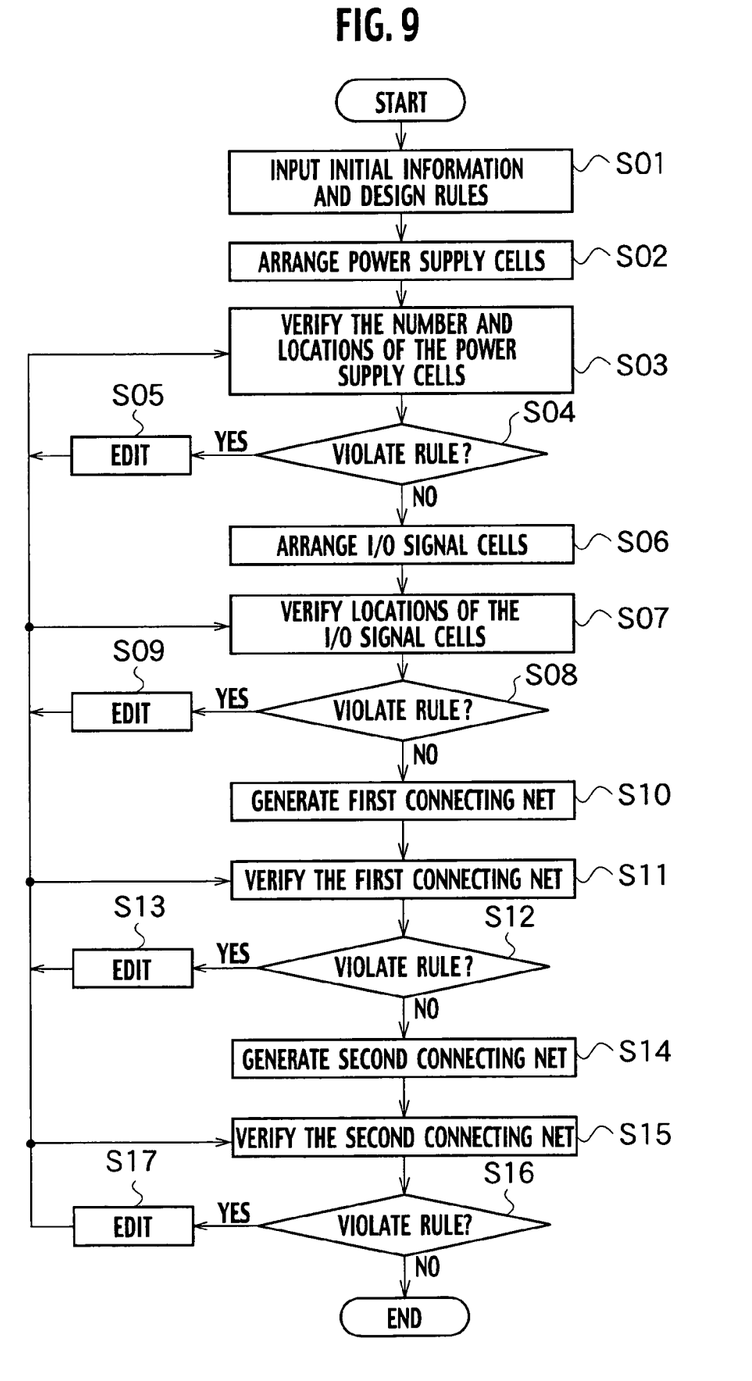
FIG. 9 is a flowchart showing a method of designing connecting terminals of a semiconductor device according to an embodiment of the present invention employing the system of FIG. 8.

FIG. 9 is a flowchart showing a method of designing connecting terminals of a semiconductor device according to an embodiment of the present invention. The method employs the system of FIG. 8 and includes stages S01 to S17.

(a) Stage S01 enters, in the input data storage unit 2 through the input unit 26, initial information 13 including signal pin information 15, a package shape library 16, and a chip shape library 17, as well as design rules 14 including a power supply cell arranging rule 18, an I/O signal cell arranging rule 19, and a connecting pin arranging rule 20 as shown in FIG. 8.

(b) In stage S02, the power supply cell arranging unit 5 arranges power supply cells at some of I/O slots formed in a semiconductor chip, according to the power supply cell arranging rule 18 stored in the input data storage unit 2. At this time, the power supply cell arranging unit 5 computes the number of required power supply cells in consideration of the simultaneous switching noise at output cells and the current consumption and conditions of use of I/O signal cells and internal cells. Power output cells are arranged close to output buffer cells, and power input cells are arranged close to input buffer cells. The appropriate number of power supply cells are arranged for a group of simultaneous switching cells. In stage S03, the power supply cell arrangement verifier 10 verifies whether the arranged power supply cells violate a predetermined design rule, i.e., the power supply cell arranging rule 18.

(c) When the number or locations of the power supply cells violate the rule, stage S04 is YES, and on the display unit 27 of FIG. 8 a message indicating the rule violation by the power supply cells as well as violating locations is displayed. Prompted by the message, an operator edits, in stage S05, the number or locations of the power supply cells by using the input unit 26 so as to solve the rule violation. Thereafter, the flow returns to stage S03 to verify whether the number and locations of the edited power supply cells violate the rule. The loop of stages S03 to S05 terminates when stage S04 provides NO to indicate there is no rule violation in the number and locations of the power supply cells, and the flow advances to stage S06.

(d) In stage S06, the I/O signal cell arranging unit 6 arranges I/O signal cells at I/O slots where no power supply cells are arranged, according to the I/O signal cell arranging rule 19. In stage S07, the I/O signal cell arrangement verifier 11 verifies whether the arranged I/O signal cells violate a predetermined design rule, i.e., the I/O signal cell arranging rule 19.

(e) When the sizes or locations of the I/O signal cells violate the rule, stage S08 is YES, on the display unit 27 a message indicating the rule violation by the I/O signal cells as well as violating locations is displayed. Prompted by the message, an operator edits, in stage S09, the number or locations of the I/O signal cells by using the input unit 26 so as to solve the rule violation. Thereafter, the flow returns to stage S07 to verify whether the sizes of the edited I/O signal cells violate the rule or the locations thereof violate prohibited areas. The loop of stages S07 to S09 terminates when stage S08 provides NO to indicate there is no rule violation in the sizes or prohibited areas (locations) of the I/O signal cells, and the flow advances to stage S10.

(f) In stage S10, the first connecting net generator 7 generates a first connecting net to connect the I/O slots to bumps formed on the semiconductor chip, according to the connecting pin arranging rule 20. The connecting pin arranging rule 20 stipulates, for example, restrictions related to intersections in the first connecting net that are determined according to the number of wiring layers in the first connecting net forming region 40 of FIG. 3B and wire intervals in the first connecting net, restrictions related to the number of rows of bumps from which leads can be made, and restrictions related to equal-length wires required by cell specifications. In stage S11, the first connecting net verifier 12 verifies whether the first connecting net violates a predetermined design rule, i.e., the connecting pin arranging rule 20.

(g) When the first connecting net violates the rule, stage S12 is YES, and on the display 27 a message indicating the rule violation by the first connecting net as well as violating locations is displayed. Prompted by the message, an operator edits, in stage S13, the bump assignment of the first connecting net by using the input unit 26 so as to solve the rule violation. Thereafter, the flow returns to stage S11 to verify whether the edited first connecting net violates the rule. The loop of stages S11 to S13 terminates when stage S12 provides NO to indicate there is no rule violation by the first connecting net, and the flow advances to stage S14.

(h) In stage S14, the second connecting net generator 8 generates a second connecting net to connect the bumps to external electrodes formed on a package base, according to the connecting pin arranging rule 20. The connecting pin arranging rule 20 stipulates, for example, restrictions related to intersections in the second connecting net that are determined according to the number of wiring layers in the package base 41 of FIG. 4B and wire intervals in the second connecting net, restrictions related to the number of rows of external electrodes from which leads can be made, and restrictions related to equal-length wires required by cell specifications. In stage S15, the second connecting net verifier 28 verifies whether the second connecting net violates a predetermined rule, i.e., the connecting pin arranging rule 20.

(i) When the second connecting net violates the rule, stage S16 is YES, on the display 27 a message indicating the rule violation by the second connecting net as well as violating locations is displayed. Prompted by the message, an operator edits, in stage S17, the external electrode assignment of the second connecting net by using the input unit 26 so as to solve the rule violation. Thereafter, the flow returns to stage S15 to verify whether the edited second connecting net violates the rule. The loop of stages S15 to S17 terminates when stage S16 provides NO to indicate there is no rule violation by the second connecting net.

(j) Lastly, the operation unit 1 stores, in the output data storage unit 3, power supply cell arrangement information 21, I/O signal cell arrangement information 22, and connecting net information 23 according to the data prepared through the stages of FIG. 9.

After the completion of the connecting terminal assignment by these stages, the automatic chip arranging/wiring process and the detailed package designing process are carried out. The automatic chip arranging/wiring process uses the first connecting net, to design actual wires between the I/O slots and bumps of the semiconductor chip. The detailed package designing process uses the second connecting net, to design actual wires between the bumps and the external electrodes of the package base.

As mentioned above, stages S02, S06, S10, and S14 assign power supply signals and I/O signals to connecting terminals including I/O slots, bumps, and external electrodes. Stages S03, S07, S11, and S15 verify the connecting terminals according to design rules. Even if correspondences between the external electrodes and the bumps and those between the bumps and the I/O slots are not clear or not sequential, the embodiment can efficiently assign the signals to the connecting terminals without violating the design rules.

According to the embodiment, specific signals such as those for differential buffers that must be assigned to adjacent connecting terminals can securely be assigned to the adjacent the I/O slots, bumps, and external electrodes.

According to the embodiment, no pin assign errors will be found in the automatic chip arranging/wiring process and detailed package designing process. Namely, there will be no need to repeat the automatic chip arranging/wiring process or the detailed package designing process.

A return path from any one of the edit stages S05, S09, S13, and S17 of FIG. 9 carried out by an operator is not limited to one. For example, when stage S08 finds a rule violation in the locations of I/O signal cells, editing is carried out in stage S09, and then, a return path will not be always to stage S07. Editing the locations of I/O signal cells may require verification of the number or locations of power supply cells. In this case, the return path will be to stage S03 instead of S07, to verify whether the power supply cells violate the rule. Similarly, editing the first and second connecting nets in stages S13 and S17 may require verification of the power supply cells or I/O signal cells. In this case, the return path will be to stage S03 or S07 instead of stage S11 or S15, to verify whether the power supply cells or I/O signal cells violate the rule.

As mentioned above, for a semiconductor device including a package base having external electrodes formed in a grid on a principle surface thereof and a semiconductor chip having bumps formed in a grid on a principle surface thereof, the embodiment is capable of efficiently and correctly assigning signals to the I/O slots, bumps, and external electrodes of the semiconductor device according to design rules. For a semiconductor device having a package coping with recent high-density, multiple-pin packaging, such as a BGA or flip-chip package, the embodiment can speedily assign signals to connecting terminals of the semiconductor device according to design requirements. In particular, the embodiment carries out design rule verification during the arrangement of I/O signal cells and rough wiring (first and second connecting nets), to avoid repeating the automatic chip arranging/wiring process or the detailed package designing process.

<Computer Program Product>

The method of designing connecting terminals of semiconductor device mentioned above is expressed in time-series processes, operations, or procedures that are executable in a computer system. Therefore, the method of designing connecting terminals of semiconductor device can be controlled by a computer program that specifies functions achieved by, for example, a processor in a computer system. The computer program may be stored in a computer program product. The computer program is read from the computer program product by a computer system and is executed thereby, to control the computer system and carry out the method of designing connecting terminals of semiconductor device. The computer program product may be used as the program storage unit 4 shown in FIG. 8. Alternatively, the computer program may be read and stored in the program storage unit 4 to control processes carried out by the operation unit 1. The computer program product may be implemented by a memory unit, a magnetic disk drive, an optical disk drive, or any other device capable of storing the computer program.

Figure 10:
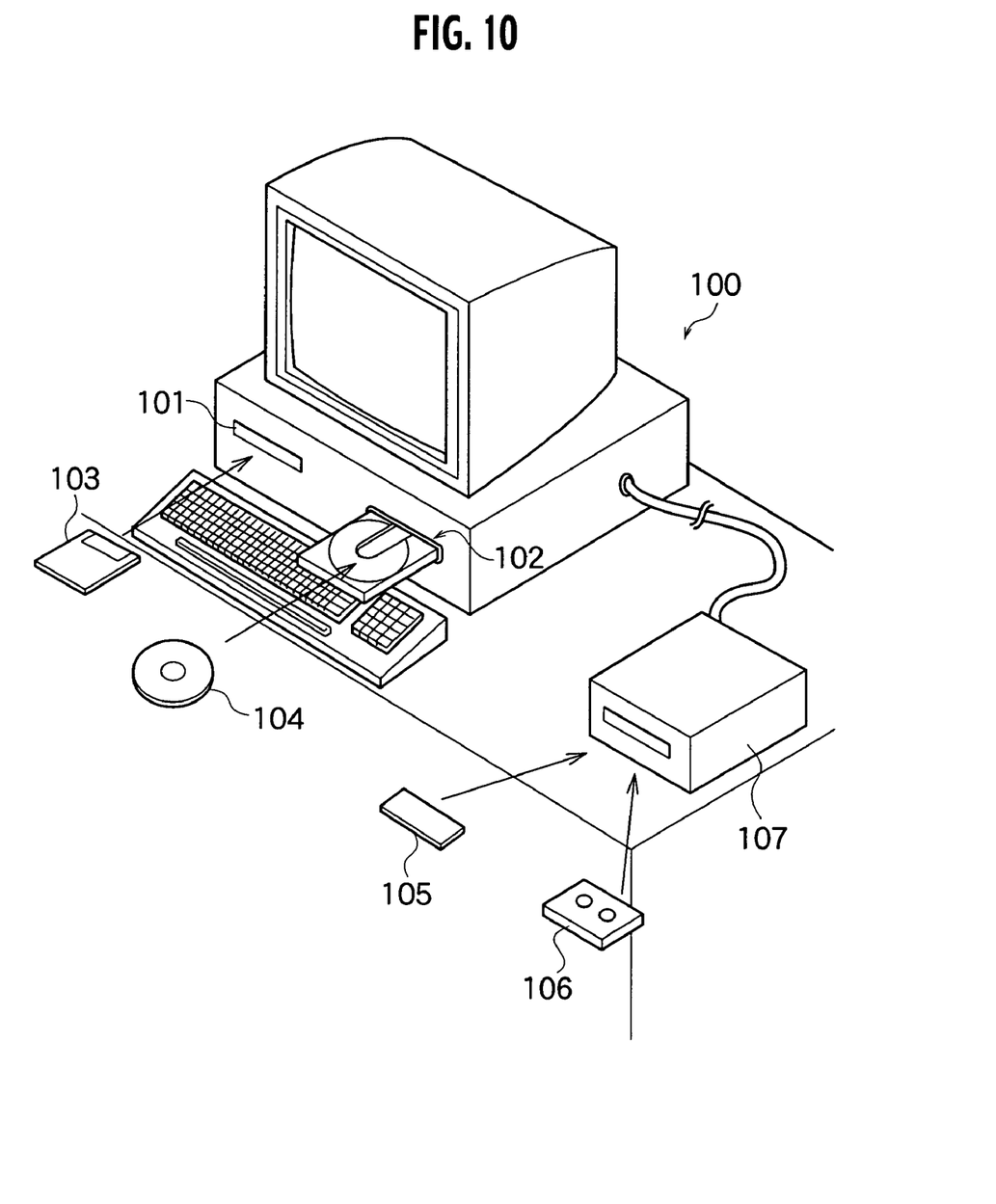
FIG. 10 is a perspective view showing an example of a system for designing connecting terminals of a semiconductor device according to an embodiment of the present invention, the system consisting of a computer system that reads a computer program product for designing connecting terminals and controls the functions of the system according to procedures stipulated in the program product, to thereby achieve a method of designing connecting terminals of a semiconductor device.

FIG. 10 shows an example of a computer system 100 serving as the system for designing connecting terminals of semiconductor device according to the embodiment of the present invention. A front area of the computer system 100 includes a flexible disk drive 101 and a CD-ROM drive 102. The flexible disk drive 101 receives a magnetic flexible disk 103 and reads programs therefrom. The CD-ROM drive 102 receives a CD-ROM 104 and reads programs therefrom. In this way, programs stored in computer program products are installed in the system 100. A drive 107 is connectable to the computer system 100, to handle a ROM 105 that is a semiconductor memory used for, for example, a game pack, or a magnetic cassette tape 106.

In this way, the embodiment of the present invention can provide a system, method, and computer program product for designing connecting terminals of a semiconductor device, capable of efficiently assigning signals to the connecting terminals according to design rules.

(Modification)

Figure 11:
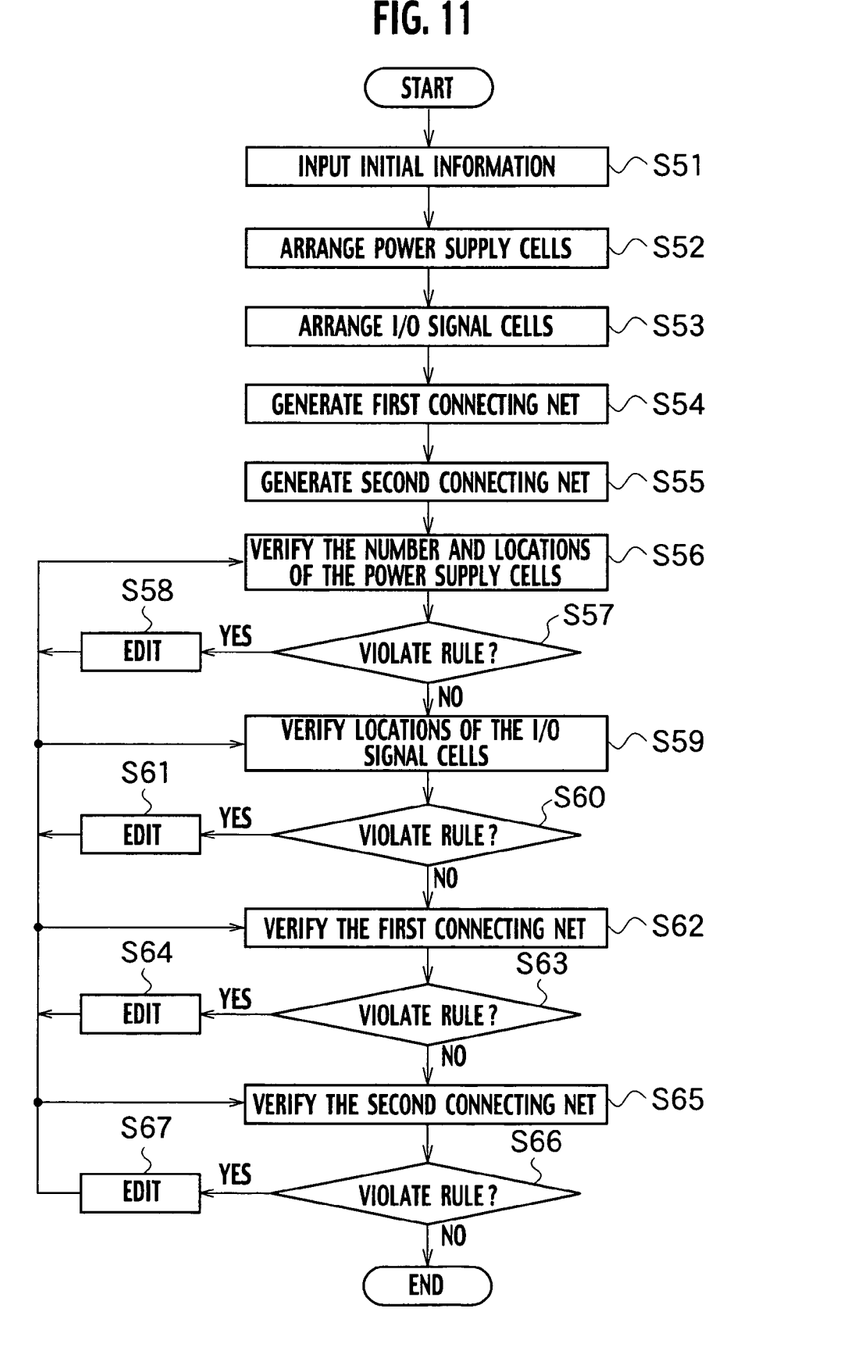
FIG. 11 is a flowchart showing a method of designing connecting terminals of a semiconductor device according to a modification of the embodiment of FIG. 9.

FIG. 11 is a flowchart showing a method of designing connecting terminals of a semiconductor device according to a modification of the method of FIG. 9.

(a) Stage S51 Enters Initial Information 13 and design rules 14 in the input data storage unit 2 of FIG. 8, as in stage S01 of FIG. 9.

(b) In stages S52 to S55, the power supply cell arranging unit 5, I/O signal cell arranging unit 6, and first and second connecting net generators 7 and 8 arrange and generate power supply cells, I/O signal cells, and first and second connecting nets. This modification arranges the power supply cells in stage S52, and without verifying the number and locations of the power supply cells, arranges the I/O signal cells in stage S53. Without verifying the locations of the I/O signal cells, the modification generates the first connecting net in stage S54 and the second connecting net in stage S55.

(c) In stage S56, the power supply cell arrangement verifier 10 verifies the number and locations of the power supply cells. When the number or the locations of the power supply cells violate the rule, stage S57 provides YES, and the violating locations are edited in stage S58. Thereafter, the power supply cells are again verified in stage S56 according to the rule.

(d) In stage S59, the I/O signal cell arrangement verifier 11 verifies the locations of the I/O signal cells. When the locations of the I/O signal cells violate the rule, stage S60 provides YES, and the violating locations are edited in stage S61. Thereafter, the I/O signal cells are again verified in stage S59 according to the rule.

(e) In stage S62, the first connecting net verifier 12 verifies the first connecting net. When the first connecting net violates the rule, stage S63 provides YES, and the violating locations are edited in stage S64. Thereafter, the first connecting net is again verified in stage S62 according to the rule.

(f) In stage S65, the second connecting net verifier 28 verifies the second connecting net. When the second connecting net violates the rule, stage S66 provides YES, and the violating locations are edited in stage S67. Thereafter, the second connecting net is again verified in stage S65 according to the rule.

Like the flowchart of FIG. 9, a return path from any one of the edit stages S58, S61, S64, and S67 carried out by an operator is not limited to one. For example, when stage S60 finds rule violations in the locations of the I/O signal cells, they are edited in stage S61, and then, a return path will not be always to stage S59. The edited I/O signal cells may require verification of the number or locations of the power supply cells. In this case, the return path will be to stage S56 instead of S59, to verify whether the power supply cells violate the rule. Similarly, editing the first and second connecting nets in stages S64 and S67 may require verification of the power supply cells or the I/O signal cells. In this case, the return path will be to stage S56 or S59 instead of stage S62 or S65, to verify whether the power supply cells or the I/O signal cells violate the rule.

When returning to a verification stage other than the preceding verification stage, the modification of FIG. 11 is more advantageous than the embodiment of FIG. 9. For example, in FIG. 9, an operator may carry out editing in stage S09 to correct rule violation by I/O signal cells, and then, stage S03 may again be carried out to verify the number and locations of power supply cells. In this case, stage S06 must be repeated to arrange the I/O signal cells. On the other hand, according to the modification of FIG. 11, an operator may carry out editing in stage S61 to correct rule violation by I/O signal cells, and then, stage S56 may again be carried out to verify the number and locations of power supply cells. In this case, stage S53 to arrange the I/O signal cells will not be repeated because the loop of stages S56 to S61 does not include stage S53. In this way, the modification of FIG. 11 can properly utilize a result of the editing carried out in stage S61 and can continue verification in stages S56, S59, S62, and S65. Namely, the modification can effectively use the previously arranged or generated power supply cells, I/O signal cells, and first and second connecting nets, to improve designing efficiency.

Other Embodiments

As mentioned above, the present invention has been described through an embodiment, and a modification thereof, however, the descriptions and drawings that constitute a portion of this disclosure should not be perceived as those limiting the present invention. Various alternative embodiments and operational techniques will become clear to persons skilled in the art from this disclosure.

The method of designing connecting terminals shown in FIG. 9 is appropriate for semiconductor devices such as the flip-chip BGA shown in FIGS. 2 to 7. In the flip-chip BGA, it is preferable to generate the first connecting net 38 after arranging the power supply cells 34 and I/O signal cells 35. It is also preferable to generate the second connecting net 45 after generating the first connecting net 38. Basically, the degree of freedom in arranging the power supply cells 34 and I/O signal cells 35, the degree of freedom in arranging the first connecting net 38, and the degree of freedom in arranging the second connecting net 45 have the following relationship:

the degree of freedom in arranging the power supply cells 34 and I/O signal cells 35<the degree of freedom in arranging the first connecting net 38<the degree of freedom in arranging the second connecting net 45.

Accordingly, the efficiency of designing and arranging these items will improve by sequentially working on them from low to high in order of the degrees of freedom. When they are arranged or designed from high to low in order of the degrees of freedom, the probability of violating design rules will increase. Typically, the first connecting net 38 is formed in a single layer, and therefore, has a lower degree of freedom in designing the same, or a narrow range of design choices. In other words, correspondences between the cells 34 and 35 and the bumps 37 are more or less predetermined. On the other hand, the second connecting net 45 is formed in multiple layers, and therefore, has a larger degree of freedom in designing the same compared with the first connecting net 38. It is more efficient, therefore, to start working on an item having a lower degree of freedom in designing or arranging it. For example, when an equal-length wiring error is found during the verification of the first connecting net 38, the error will be absorbed when generating the second connecting net 45.

The method of designing connecting terminals according to the present invention is not limited to the embodiments of FIGS. 9 and 11. The present invention is applicable not only to semiconductor devices employing the flip-chip BGAs but also to semiconductor devices employing other packages such as QFPs. When applied to the QFP, an embodiment of the present invention may first generate and verify a second connecting net (stages S14 to S17 of FIG. 9), then generate and verify a first connecting net (stages S10 to S13 of FIG. 9), and lastly arrange and verify I/O signal cells and power supply cells (stages S02 to S09 of FIG. 9).

According to the embodiment of FIG. 5, the bumps 37 are arranged over the principle surface of the semiconductor chip 31 and the external electrodes 43 over the principle surface of the package base 41. This configuration does not limit the present invention. According to an embodiment of the present invention, the bumps 37 may be formed on part of the semiconductor chip 31, and the external electrodes 43 on part of the package base 41. For example, in FIG. 5, a grid of the external electrodes 43 may be formed in a partial area excluding the chip area 46 on the principle surface of the package base 41. For example, in FIG. 3A, a grid of the bumps 37 may be formed in a partial area excluding the area where the internal cell 32 is formed on the principle surface of the semiconductor chip 31.

Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A system for designing connecting terminals of a semiconductor device, comprising:
    a power supply cell arranging unit configured to arrange power supply cells at some of I/O slots formed in a semiconductor chip;
    an I/O signal cell arranging unit configured to arrange I/O signal cells at some of the I/O slots where the power supply cells are not arranged;
    a first connecting net generator configured to generate a first connecting net connecting the I/O slots to bumps formed on the semiconductor chip;
    a second connecting net generator configured to generate a second connecting net connecting the bumps to external electrodes formed on a package base; and
    a verifier configured to verify whether the power supply cells, I/O signal cells, and first and second connecting nets violate predetermined design rules.

2. The system of claim 1, wherein the first connecting net connects the I/O slots where the power supply cells and I/O signal cells are arranged to the bumps, and the second connecting net connects the bumps that are connected to the I/O slots through the first connecting net to the external electrodes.

3. The system of claim 1, wherein the bumps are formed over a principle surface of the semiconductor chip, and the external electrodes are formed over a principle surface of the package base.

4. The system of claim 1, wherein the design rules include:
    a power supply cell arranging rule concerning the number and locations of the power supply cells;
    an I/O signal cell arranging rule concerning the sizes of the I/O signal cells and prohibited areas where the I/O signal cells must not be arranged; and
    a connecting pin arranging rule concerning requirements for equal-length wires and pair wires, a restriction on the number of intersections in each of the first and second connecting nets, and a maximum wiring length.

5. The system of claim 1, wherein the power supply cell arranging unit arranges the power supply cells according to a power supply cell arranging rule concerning the number and locations of the power supply cells, the I/O signal cell arranging unit arranges the I/O signal cells according to an I/O signal cell arranging rule concerning the sizes of the I/O signal cells and prohibited areas where the I/O signal cells must not be arranged, and the first and second connecting net generators generate the first and second connecting nets according to a connecting pin arranging rule concerning requirements for equal-length wires and pair wires, a restriction on the number of intersections in each of the first and second connecting nets, and a maximum wiring length.

6. A method of designing connecting terminals of a semiconductor device, comprising:
    arranging power supply cells at some of I/O slots formed in a semiconductor chip;
    arranging I/O signal cells at some of the I/O slots where the power supply cells are not arranged;
    generating a first connecting net connecting the I/O slots to bumps formed on the semiconductor chip;
    generating a second connecting net connecting the bumps to external electrodes formed on a package base; and
    verifying whether the power supply cells, I/O signal cells, and first and second connecting nets violate predetermined design rules.

7. The method of claim 6, wherein the first connecting net is generated after arranging the power supply cells and I/O signal cells, and the second connecting net is generated after generating the first connecting net.

8. The method of claim 6, wherein the design rules include:
    a power supply cell arranging rule concerning the number and locations of the power supply cells;
    an I/O signal cell arranging rule concerning the sizes of the I/O signal cells and prohibited areas where the I/O signal cells must not be arranged; and
    a connecting pin arranging rule concerning requirements for equal-length wires and pair wires, a restriction on the number of intersections in each of the first and second connecting nets, and a maximum wiring length.

9. The method of claim 6, wherein the power supply cells are arranged according to a power supply cell arranging rule concerning the number and locations of the power supply cells, the I/O signal cells are arranged according to an I/O signal cell arranging rule concerning the sizes of the I/O signal cells and prohibited areas where the I/O signal cells must not be arranged, and the first and second connecting nets are arranged according to a connecting pin arranging rule concerning requirements for equal-length wires and pair wires, a restriction on the number of intersections in each of the first and second connecting nets, and a maximum wiring length.

10. A computer program product for designing connecting terminals of a semiconductor device, comprising:
- instructions configured to arrange power supply cells at some of I/O slots formed in a semiconductor chip;
- instructions configured to arrange I/O signal cells at some of the I/O slots where the power supply cells are not arranged;
- instructions configured to generate a first connecting net connecting the I/O slots to bumps formed on the semiconductor chip;
- instructions configured to generate a second connecting net connecting the bumps to external electrodes formed on a package base; and
- instructions configured to verify whether the power supply cells, I/O signal cells, and first and second connecting nets violate predetermined design rules.

11. The computer program product of claim 10, wherein the first connecting net is generated after arranging the power supply cells and I/O signal cells, and the second connecting net is generated after generating the first connecting net.

12. The computer program product of claim 10, wherein the design rules include:
- a power supply cell arranging rule concerning the number and locations of the power supply cells;
- an I/O signal cell arranging rule concerning the sizes of the I/O signal cells and prohibited areas where the I/O signal cells must not be arranged; and
- a connecting pin arranging rule concerning requirements for equal-length wires and pair wires, a restriction on the number of intersections in each of the first and second connecting nets, and a maximum wiring length.

13. The computer program product of claim 10, wherein the power supply cells are arranged according to a power supply cell arranging rule concerning the number and locations of the power supply cells, the I/O signal cells are arranged according to an I/O signal cell arranging rule concerning the sizes of the I/O signal cells and prohibited areas where the I/O signal cells must not be arranged, and the first and second connecting nets are arranged according to a connecting pin arranging rule concerning requirements for equal-length wires and pair wires, a restriction on the number of intersections in each of the first and second connecting nets, and a maximum wiring length.

* * * * *